United States Patent [19]
Weber et al.

[11] Patent Number: 6,069,916
[45] Date of Patent: May 30, 2000

[54] INTERFACE CIRCUIT

[75] Inventors: Stephan Weber; Volker Thomas, both of Munich, Germany

[73] Assignee: Siemens Aktiengesellschaft, Munich, Germany

[21] Appl. No.: 08/904,379

[22] Filed: Aug. 1, 1997

[30] Foreign Application Priority Data

Aug. 1, 1996 [DE] Germany .................... 196 31 117

[51] Int. Cl.$^7$ ............................... H04B 1/38; H04L 5/16
[52] U.S. Cl. ........................................... 375/219
[58] Field of Search ................................ 375/219

[56] References Cited

U.S. PATENT DOCUMENTS 5,208,830   5/1993   Cornec et al. .................... 375/1
5,355,390   10/1994  Yamamoto et al. ............... 375/260

OTHER PUBLICATIONS

"Bus–Ansteuerung—kein Problem" (Bus access—no problem), Ramanatha V. Balakrishnan, Elektronik, 1985, pp. 127–130.
"Electronic Circuits Design and Applications", U. Tietze et al., Springer–Verlag Berlin, Heidelberg, 1991, pp. 608–629.
"Eliminating Crosstalk Over Long Distance Busing", Ramanatha V. Balakrishnan, Computer Design, Mar. 1982, pp. 155–162.

*Primary Examiner*—Stephen Chin
*Assistant Examiner*—Thomas E McKiernan
*Attorney, Agent, or Firm*—Herbert L. Lerner; Laurence A. Greenberg; Werner H. Stemer

[57] ABSTRACT

An interface circuit for transmitting binary signals includes a signal transmitting device, a signal receiving device and a transmission device connected therebetween. The signal transmitting device has a device for limiting steepness of ascending and descending edges of the binary signals to certain inclination values which are identical to one another.

6 Claims, 1 Drawing Sheet

INTERFACE CIRCUIT

BACKGROUND OF THE INVENTION

Field of the Invention

The invention relates to an interface circuit for transmitting binary signals, having a signal transmitting device, a signal receiving device and a transmission device disposed between them.

Such interface circuits are known in manifold versions, for instance from a book by U. Tietze and C. Schenk, entitled: Electronic Circuits—Design and Applications, Springer-Verlag Berlin, Heidelberg 1991, pp. 608–629. The problem of interference in analog circuit parts occurs very frequently in the transmission of binary signals in conjunction with sensitive analog circuits. Admittedly, the interferences can be reduced by lowering the signal amplitude, but that often makes the interface itself more vulnerable to interference. Reducing the signal amplitude is especially critical whenever the switchover time, for instance from high to low, is to be detected precisely. As a rule, the steepest possible pulses with high amplitude are employed for that purpose, but they have an especially broad signal spectrum and therefore a major interfering effect. Moreover, steep pulses involve the risk of the ascending and descending edges of the binary signals being flattened in different ways by the transmitting device, so that other transmission errors result because of the thus-altered duty cycle.

SUMMARY OF THE INVENTION

It is accordingly an object of the invention to provide an interface circuit, which overcomes the hereinaforementioned disadvantages of the heretofore-known devices of this general type and which has not only high transmission precision but also only low intrinsic vulnerability to malfunction and only a slight interfering effect on other circuit elements.

With the foregoing and other objects in view there is provided, in accordance with the invention, an interface circuit for transmitting binary signals, comprising a signal transmitting device; a signal receiving device; and a transmission device connected between the signal transmitting device and the signal receiving device; the signal transmitting device having a device for limiting steepness of ascending and descending edges of binary signals to certain mutually identical inclination values.

Active and passive security against interference, with high transmission precision, is attained in the interface circuit of the invention in particular due to the fact that the signal transmitting device has a device for limiting the steepness of the ascending and descending edges of the binary signals to certain inclination values which are identical to one another. Flattening the signal edges makes the interference spectrum narrower, so that the active security against interference, or in other words the interfering effect on other circuit elements, is reduced. However, the signal amplitude is preserved, so that the passive security against interference, or in other words the interfering effect of other circuit elements on the interface, is not impaired thereby. Moreover, band-limiting effects of the transmitting device on the interface are largely precluded by reducing the bandwidth.

In accordance with another feature of the invention, the signal transmitting device transmits the binary signals in the form of suitably impressed currents through the transmission device to the receiving device. The signal transmitting device is constructed as a source with as high impedance as possible, while the signal receiving device has a current input with the least possible impedance. As a result, the voltage rise at the transmitting device is very slight, and as a result a capacitive interference, in particular to other circuit elements, is greatly reduced.

A further improvement is made possible by an in-phase symmetrical signal course, because then the interference signals at the potentially susceptible equipment largely cancel one another out, while the differential signal is even equivalent to twice the single amplitude. Therefore, in accordance with a further feature of the invention, the signal transmitting device, the transmission device and the signal receiving device are constructed for transmitting symmetrical binary signals.

In accordance with an added feature of the invention, in order to obtain the differential signal, a subtraction device is provided in the signal receiving device.

In accordance with an additional feature of the invention, in order to limit the edge steepness, an integrating device, in particular, is provided in the signal branch of the signal transmitting device, is triggered with the binary signals to be transmitted and guarantees a uniform, linear ascent or descent of the edges upon triggering with square signals.

In accordance with yet another feature of the invention, the integration device includes at least one Miller capacitor in combination with a transistor located in the signal branch. Since the transistor is usually present anyway, an integrator is realized at little additional expense through the use of the Miller capacitor connected between the base and the collector of the transistor.

In accordance with a concomitant feature of the invention, the signal receiving device is followed by comparators, preferably so that binary signals with steep edges can again be generated from the signals with a shallow edge. The comparator threshold is preferably placed in the middle between the maximum and minimum amplitude of the signal being transmitted.

Other features which are considered as characteristic for the invention are set forth in the appended claims.

Although the invention is illustrated and described herein as embodied in an interface circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
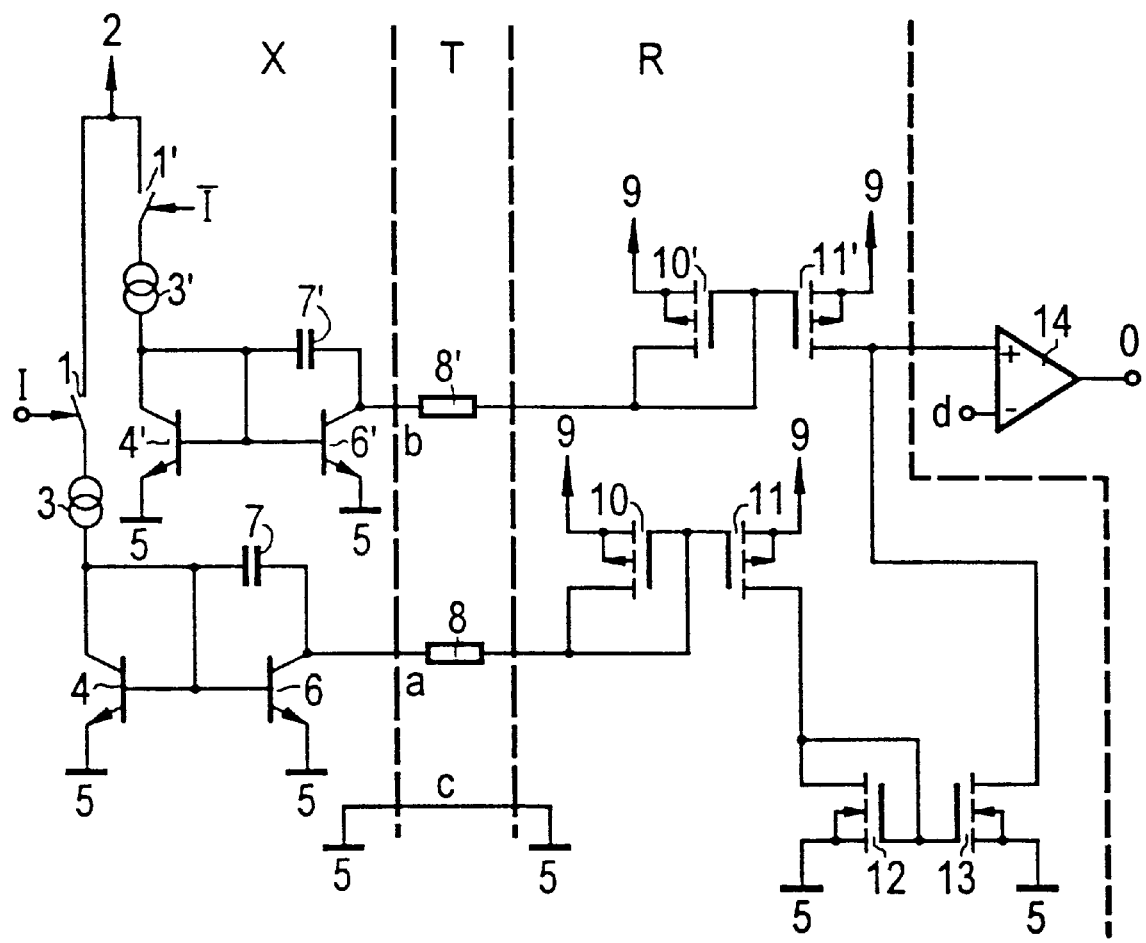
FIG. 1 is a schematic diagram of an exemplary embodiment of an interface circuit of the invention.

Referring now to the figures of the drawings in detail and first, particularly, to FIG. 1 thereof, there is seen an interface circuit which is shown as an exemplary embodiment and in which a signal transmitting device X, a signal receiving device R and between them a transmitting device T are provided. The signal transmitting device X, the transmission device T and the signal receiving device R are constructed to be symmetrical to one another, at least at connecting locations.

Along with other non-illustrated circuit elements, the signal transmitting device X includes two switch devices 1 and 1' triggered in phase by respective input signals I and Ī. The switch devices 1 and 1' each impose a positive supply potential 2 through a respective current source 3 and 3' on an input circuit of a respective current mirror. The current mirrors each include one npn transistor 4 and 4' each having an emitter which is connected to a reference potential 5 and a base and a collector that are coupled on one hand to the respective associated current source 3 or 3' and on the other hand to a base of a further respective npn transistor 6 and 6'. The transistors 6 and 6' have emitters which are connected to the reference potential 5, collectors that form symmetrical outputs of the signal transmitting device and bases which are connected through respective capacitors 7 and 7' to the collectors thereof. The capacitors 7 and 7', in conjunction with the transistors 6 and 6', form Miller capacitors, which represent an integration device for flattening ascending and descending edges of binary signals to be transmitted. The inclination of the ascending and descending edges is the same, because of the integration. The binary signals to be transmitted are split into two complementary signals and serve as the signals I and Ī for triggering the switch devices 1 and 1'.

In the simplest case, the transmission device T includes a multi-wire line, for instance with three wires or strands a, b, c, where the wire c transmits the reference potential 5. The wires a and b have a certain line resistance or else, as is shown in the exemplary embodiment, one resistor 8 and 8' which is connected into each respective line a and b essentially determines a conduction resistance of the transmitting device T and can, for instance, also be used to adjust the current.

The signal receiving device R has an input side which includes two current mirrors referred to a positive supply potential 9. On the input side, the current mirrors each include an MOS field effect transistor 10, 10' of the p-channel type having a source terminal which is connected to the positive supply potential 9. Gate and drain terminals of the transistors 10 and 10' are connected on one hand to one another and on the other hand to a gate terminal of a respective MOS field effect transistor 11 and 11' and are also coupled through the respective resistors 8 and 8' to the collectors of the transistors 6 and 6'. Drain terminals of the transistors 11 and 11' are likewise connected to the positive supply potential 9. The drain terminal of the transistor 11 is connected to drain and gate terminals of an n-channel MOS field effect transistor 12 and to a gate terminal of an n-channel MOS field effect transistor 13. Source terminals of the transistors 12 and 13 are connected to the reference potential 5. The drain terminals of the transistors 13 and 11' are joined together and connected to a noninverting input of a comparator 14. The transistors 10, 10' to 13 form a subtractor, which produces asymmetrical signals from the symmetrical signals transmitted by the transmission device T. However, these asymmetrical signals have flattened edges which are to be converted by the following comparator 14 into steep edges. To that end, a current d characterizing a threshold value is applied to an inverting input of the comparator 14. An output signal O appears at an output of the comparator 14 by comparison with the threshold value d. The output signal O substantially corresponds to the signal on which the input signals I and Ī are based.

Figure 2:
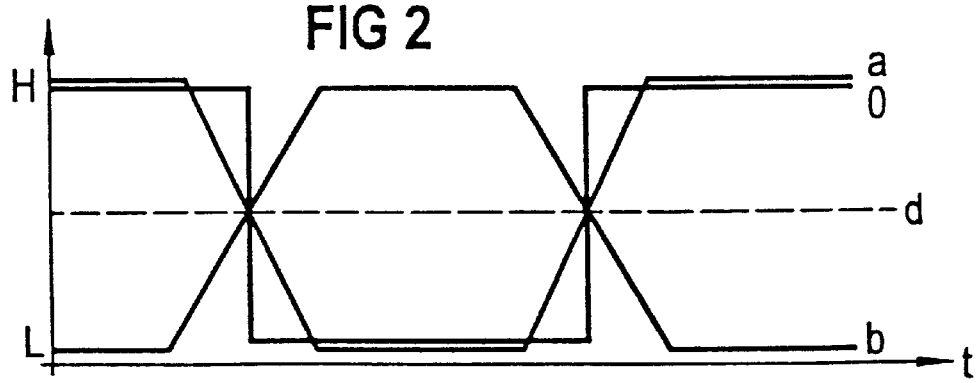
FIG. 2 is a graph showing a signal course in a transmitting device in the interface circuit of FIG. 1.

Courses of various signals over time t for the interface circuit of FIG. 1 are shown in FIG. 2. A signal on a line a is initially at a high level H and drops gradually after a certain time to a lower level L. Correspondingly, a signal on a line b is first at the lower level L and after that certain time gradually rises in the same way as the signal on the line a decreases. Subsequently, the signal on the line a is at the low level L and the signal on the line b is at the high level H. The signal on the line b then gradually drops, while the signal on the line a corresponding rises. After that, the signal on the line a is again at the high level H and the signal on the line b is again at the lower level L. If the signal d of the comparator 14, which is contemplated as a threshold, is then placed exactly in the middle between the high level H and the low level L and a differential signal between the two signals transmitted on the lines a and b is weighted by comparison, then the resultant course for the output signal O is one in which the signal O is first at the high level H. The signal O likewise drops from the high level H to the low level L at an intersection of the descending edge of the signal on the line a and the ascending edge of the signal on the line b, or in other words at that time. In the same way, at the next intersection of the descending edge of the signal on the line b and the ascending edge of the signal on line a, the signal O changes from the low level L to the high level H. The overall result is thus an asymmetrical binary signal with steep edges and an exact duty cycle.

We claim:

1. An interface circuit for transmitting binary signals, comprising:

a signal transmitting device;

a signal receiving device; and a transmission device connected between said signal transmitting device and said signal receiving device;

said signal transmitting device having a device for limiting steepness of ascending and descending edges of binary signals to certain mutually identical inclination values;

said signal transmitting device having a current mirror circuit having an input branch controllable by one of two binary signals and an output branch coupled to said transmission device; and said output branch of said current mirror circuit having a transistor with capacitive feedback coupling.

2. The interface circuit according to claim 1, including a comparator downstream of said signal receiving device.

3. The interface circuit according to claim 1, wherein said output branch of the current mirror circuit defines a collector-emitter part of said transistor;

a capacitor is connected between a collector and a base of said transistor; and said base of said transistor is connected to said input branch of said current mirror circuit.

4. The interface circuit according to claim 3, wherein said collector of said transistor of said signal transmitting device being connected to said transmission device and said emitter of said transistor of said signal transmitting device being connected to reference potential.

5. The interface circuit according to claim 1, wherein said signal transmitting device, said transmission device and said signal receiving device are constructed to transmit mutually symmetrical binary signals.

6. The interface circuit according to claim 5, wherein said signal receiving device includes a subtraction device for converting signals which are symmetrical to each other and transmitted through said transmission device into asymmetrical signals.

* * * * *